US012660515B2

(12) United States Patent
Xu et al.

(10) Patent No.: US 12,660,515 B2
(45) Date of Patent: Jun. 16, 2026

(54) THREE-DIMENSIONAL RESERVOIR BASED ON VOLATILE THREE-DIMENSIONAL MEMRISTOR AND MANUFACTURING METHOD THEREFOR

(71) Applicant: INSTITUTE OF MICROELECTRONICS, CHINESE ACADEMY OF SCIENCES, Beijing (CN)

(72) Inventors: Xiaoxin Xu, Beijing (CN); Wenxuan Sun, Beijing (CN); Jie Yu, Beijing (CN); Woyu Zhang, Beijing (CN); Danian Dong, Beijing (CN); Jinru Lai, Beijing (CN); Xu Zheng, Beijing (CN); Dashan Shang, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 392 days.

(21) Appl. No.: 18/277,977

(22) PCT Filed: Mar. 10, 2022

(86) PCT No.: PCT/CN2022/080060
§ 371 (c)(1),
(2) Date: Aug. 18, 2023

(87) PCT Pub. No.: WO2023/137844
PCT Pub. Date: Jul. 27, 2023

(65) Prior Publication Data
US 2024/0130251 A1 Apr. 18, 2024

(30) Foreign Application Priority Data
Jan. 18, 2022 (CN) .......................... 202210055435.0

(51) Int. Cl.
H10N 70/20 (2023.01)
H10B 63/00 (2023.01)
H10N 70/00 (2023.01)

(52) U.S. Cl.
CPC ........... *H10N 70/20* (2023.02); *H10B 63/845* (2023.02); *H10N 70/011* (2023.02)

(58) Field of Classification Search
CPC ..... H10B 63/845; H10N 70/011; H10N 70/20
See application file for complete search history.

(56) References Cited

U.S. PATENT DOCUMENTS 12,268,042 B2 * 4/2025 Kim ....................... H10K 10/50
2016/0276588 A1 9/2016 Tour et al.
(Continued)

FOREIGN PATENT DOCUMENTS

CN 102738387 10/2012
CN 104485418 A 4/2015
(Continued)

OTHER PUBLICATIONS

International Search Report and Written Opinion for PCT/CN2022/080060, 8 pages.
(Continued)

*Primary Examiner* — Mark V Prenty
(74) *Attorney, Agent, or Firm* — Goodwin Procter LLP

(57) ABSTRACT

A three-dimensional reservoir based on three-dimensional volatile memristors and a method for manufacturing the same. In the three-dimensional reservoir, a memory layer, a select layer, and an electrode layer in each via form a memristor which is a reservoir unit. The three-dimensional reservoir is formed based on a stacking structure and multiple vias. The three-dimensional reservoir is constructed by using virtual nodes generated from dynamic characteristics of the three-dimensional memristors. An interfacial mem-
(Continued)

ristor is first constructed, and its volatility is verified through electric tests. A vertical three-dimensional array is manufactured based on the volatile memristor. A dynamic characteristic of the memristor is adjusted through a Schottky barrier. Different layers in the three-dimensional reservoir correspond to different reservoirs, which are constructed by controlling memristors in the different layers, respectively.

8 Claims, 4 Drawing Sheets

(56) References Cited

U.S. PATENT DOCUMENTS

| | | | |
|---|---|---|---|
| 2020/0303463 A1 | 9/2020 | Redaelli | |
| 2023/0301095 A1* | 9/2023 | Han | H10B 63/80 |

FOREIGN PATENT DOCUMENTS

| | | |
|---|---|---|
| CN | 105745754 | 7/2016 |
| CN | 106206944 | 12/2016 |
| CN | 113078262 | 7/2021 |

OTHER PUBLICATIONS

Xu, X-X, et al., Resistive switching memory for high density storage and computing, Chin. Phys. B, vol. 30, No. 5 (2021), only pp. 058702-1 and 058702-12.

First Office Action in Chinese Patent Application No. 2022100554350 (issued Aug. 21, 2025).

* cited by examiner

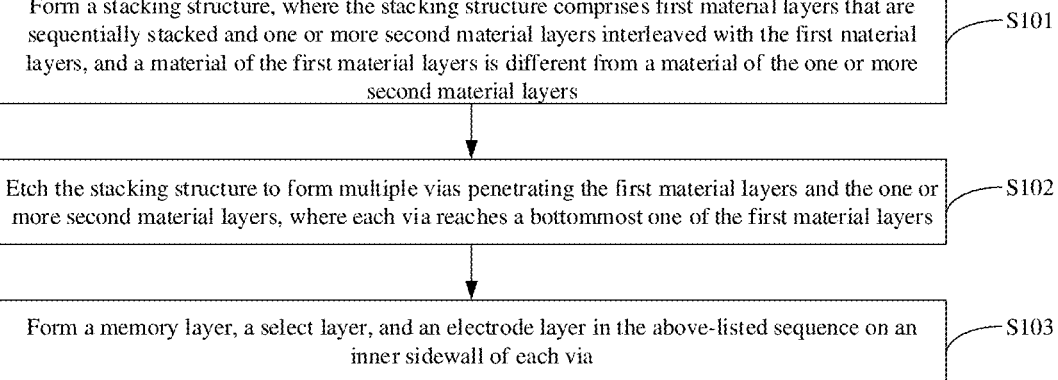

Form a stacking structure, where the stacking structure comprises first material layers that are sequentially stacked and one or more second material layers interleaved with the first material layers, and a material of the first material layers is different from a material of the one or more second material layers ⟋— S101

Etch the stacking structure to form multiple vias penetrating the first material layers and the one or more second material layers, where each via reaches a bottommost one of the first material layers ⟋— S102

Form a memory layer, a select layer, and an electrode layer in the above-listed sequence on an inner sidewall of each via ⟋— S103

Figure 7

THREE-DIMENSIONAL RESERVOIR BASED ON VOLATILE THREE-DIMENSIONAL MEMRISTOR AND MANUFACTURING METHOD THEREFOR

This application is the national phase of International Application No. PCT/CN2022/080060, titled "THREE-DIMENSIONAL RESERVOIR APPARATUS BASED ON THREE-DIMENSIONAL VOLATILE MEMRISTORS AND METHOD FOR MANUFACTURING THE SAME", filed on Mar. 10, 2022, which claims priority to Chinese Patent Application No. 202210055435.0, titled "THREE-DIMENSIONAL RESERVOIR BASED ON VOLATILE THREE-DIMENSIONAL MEMRISTOR AND MANUFACTURING METHOD THEREFOR", filed on Jan. 18, 2022 with the China National Intellectual Property Administration. Each of the above-referenced related applications is hereby incorporated by reference in its entirety.

FIELD

The present disclosure relates to the technical field of semiconductors, and in particular to a three-dimensional reservoir apparatus based on three-dimensional volatile memristors and a method for manufacturing the three-dimensional reservoir based on the three-dimensional volatile memristors.

BACKGROUND

Traditional computing paradigms are subject to the slow-down of Moore's Law and the von Neumann bottleneck with soaring development of artificial intelligence technology and applications, and computing paradigms having higher energy efficiency and a stronger computing capability have become an urgent need. The brain-inspired computing is one of the most potential computing paradigms.

Memristors have great advantages in hardware implementation of artificial neural networks due to their special characteristics. At present, most researches on memristors focus on how to use their analog resistive switching and non-volatility to implement addition and multiplication based on a memristor array. In comparison, few researches have been conducted on the dynamic characteristic and nonlinearity of the memristors.

Reservoir computing (RC) is a simple and efficient brain-inspired scheme that can process time-dependent signals reasonably. The reservoir computing originates from the echo state network proposed by H. Jaeger et al. in 2001, and the liquid state machine proposed by W. Maass et al. in 2002. The reservoir computing has drawn widespread academic attention in in recent years.

The reservoir computing utilizes inherent nonlinearity and volatility of the memristors to construct a "reservoir". Compared with a traditional recurrent neural network (RNN), the reservoir is a replacement of the intermediate layer, and it is only required to iterate weights of connections from the reservoir to the output layer in the training. Thereby, a process of training the network is significantly simplified.

In conventional technology, reservoir computing has been widely applied to time series prediction, pattern recognition, wireless communication, and other fields. In current researches, the reservoir computing based on memristors merely relate to constructing a reservoir network based on a planar memristor array.

The era of information explosion provides numerous and more complex tasks. Requirements of miniaturization, low power consumption, and high accuracy need to be met, and energy efficiency and a degree of parallelism of RC systems need to be improved, and information processing in the RC systems needs be accelerated to achieve real-time processing on input signals. Hence, there is a demand on devices of a higher density and an optimized combination of such devices with a network structure of the reservoir.

SUMMARY

In view of the above, a three-dimensional reservoir based on three-dimensional volatile memristors and a method for manufacturing the three-dimensional reservoir are provided according to embodiments of the present disclosure. The foregoing issue is addressed with following technical solutions.

A three-dimensional reservoir based on three-dimensional volatile memristors is provided, comprising: a stacking structure, comprising first material layers that are sequentially stacked, and one or more second material layers interleaved with the first material layers, where a material of the first material layers is different from a material of the one or more second material layers; multiple vias penetrating the first material layers and the one or more second material layers, where each via reaches a bottommost one of the first material layers; and a memory layer, a select layer, and an electrode layer, which are disposed in the above-listed sequence on an inner sidewall of each via.

In an embodiment, the multiple vias are arranged in an array.

In an embodiment, a thickness of each first material layer ranges from 10 nm to 200 nm.

In an embodiment, a thickness of each second material layer ranges from 5 nm to 100 nm.

In an embodiment, a thickness of the memory layer ranges from 2.5 nm to 6 nm.

In an embodiment, a thickness of the select layer ranges from 5 nm to 20 nm.

In an embodiment, each first material layer is made of $SiO_2$, and each second material layer is made of TiN or TaN.

A method for manufacturing a three-dimensional reservoir which is based on three-dimensional volatile memristors, comprising: forming a stacking structure, where the stacking structure comprises first material layers that are sequentially stacked and one or more second material layers interleaved with the first material layers, and a material of the first material layers is different from a material of the one or more second material layers; etching the stacking structure to form multiple vias penetrating the first material layers and the one or more second material layers, where each via reaches a bottommost one of the first material layers; and forming a memory layer, a select layer, and an electrode layer in the above-listed sequence on an inner sidewall of each via.

Compared with the conventional technology, the beneficial effects realized by the present disclosure are as follows.

According to embodiments of the present disclosure, the three-dimensional reservoir based on three-dimensional volatile memristors comprises: the stacking structure, comprising the first material layers that are sequentially stacked, and the one or more second material layers interleaved with the first material layers, where the material of the first material layers is different from the material of the one or more second material layers; the multiple vias penetrating the first material layers and the one or more second material layers, where each via reaches a bottommost one of the first material layers; and the memory layer, the select layer, and the electrode layer, which are disposed in the above-listed sequence on the inner sidewall of each via.

The memory layer, the select layer, and the electrode layer in each via form a memristor, i.e., form a reservoir unit. The three-dimensional reservoir is formed based on the stacking structure and the multiple vias. Specifically, the three-dimensional reservoir is constructed by using virtual nodes generated from dynamic characteristics of the three-dimensional memristors. An interfacial memristor is first constructed, and its volatility is verified through electric tests. A vertical three-dimensional array is manufactured based on the volatile memristor. A dynamic characteristic of the memristor is adjusted through a Schottky barrier. Different layers in the three-dimensional reservoir correspond to different reservoirs, which are constructed by controlling memristors in the different layers, respectively. The virtual nodes are enriched, a degree of parallelism and recognition accuracy of a whole system are improved, and an area of the system is reduced.

BRIEF DESCRIPTION OF THE DRAWINGS

For clearer illustration of the technical solutions according to embodiments of the present disclosure or conventional techniques, hereinafter briefly described are the drawings to be applied in embodiments of the present disclosure or conventional techniques. Apparently, the drawings in the following descriptions are only some embodiments of the present disclosure and other drawings may be obtained by those ordinary skilled in the art based on the provided drawings without creative efforts.

FIG. 7 is a schematic flowchart of a method for manufacturing three-dimensional reservoir, which is based on three-dimensional volatile memristors, according to an embodiment of the present disclosure.

DETAILED DESCRIPTION OF EMBODIMENTS

Hereinafter the technical solutions in the embodiments of the present disclosure are described clearly and thoroughly in conjunction with the accompanying drawings in the embodiments of the present disclosure. Apparently, the described embodiments are only some rather than all of the embodiments of the present disclosure. Any other embodiments obtained based on the embodiments of the present disclosure by those ordinary skilled in the art without any creative effort fall within the scope of protection of the present disclosure.

In order to make the above objects, features and advantages of the present disclosure more comprehensible, hereinafter the present disclosure will be further described in detail in conjunction with the drawings and specific embodiments.

Figure 1:
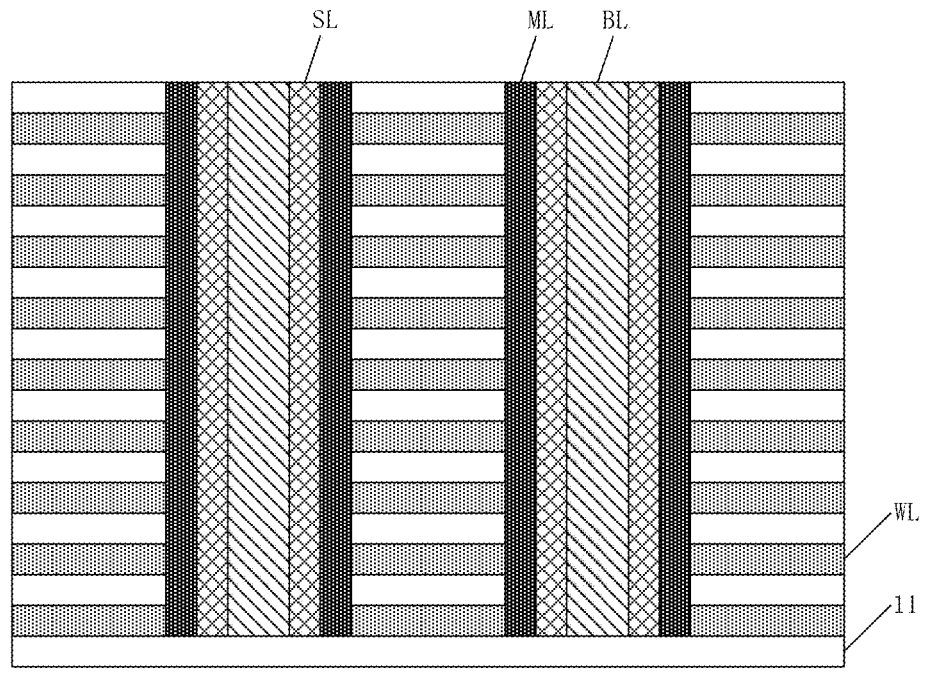
FIG. 1 is a schematic section view of a three-dimensional volatile memristor according to an embodiment of the present disclosure.
Figure 2:
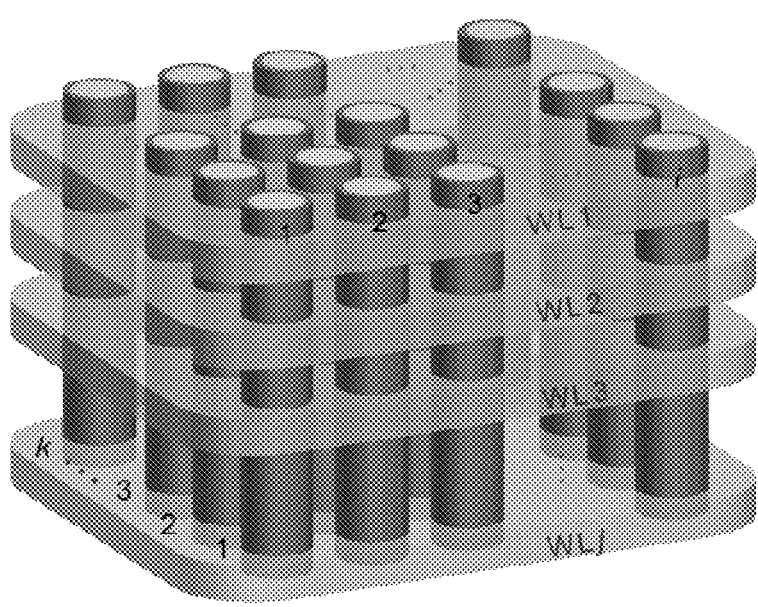
FIG. 2 is a schematic diagram of a partial three-dimensional structure of a volatile three-dimensional memristor according to an embodiment of the present disclosure.

Reference is made to FIG. 1, which is a schematic section view of a volatile three-dimensional memristor according to an embodiment of the present disclosure. Reference is made to FIG. 2, which is a schematic diagram of a partial three-dimensional structure of a volatile three-dimensional memristor according to an embodiment of the present disclosure.

The three-dimensional reservoir comprises a stacking structure, multiple vias, a memory layer, a select layer, and an electrode layer.

The stacking structure comprises first material layers 11 that are sequentially stacked and one or more second material layers WL interleaved with the first material layers. A material of the first material layers 11 is different from a material of the one or more second material layers WL.

The multiple vias penetrate the first material layers 11 and the one or more second material layers WL. Each via reaches a bottommost one of the first material layers 11.

The memory layer ML, the select layer SL, and the electrode layer BL are disposed in the above-listed sequence on an inner sidewall of each via.

The first material layers 11 are not depicted in FIG. 2.

In this embodiment, the uppermost layer and the bottommost layer of the stacking structure are both first material layers 11. Each second material layer WL is located between two adjacent ones of the first material layers 11.

As an example, the first material layer 11 provides interlayer insulation. The first material layer 11 is made of insulating materials, including but not limited to $SiO_2$ or the like.

In an embodiment, a thickness of the first material layer 11 ranges from 10 nm to 200 nm. For example, the thickness of the first material layer 11 is 35 nm, 68 nm, 115 nm, 167 nm, or the like.

The second material layer WL serves as a word line of the three-dimensional reservoir. The second material layer is made of a material including but not limited to TiN or TaN.

In an embodiment, a thickness of the second material layer WL ranges from 5 nm to 100 nm. For example, the thickness of the second material layer WL is 8 nm, 35 nm, 76 nm, 88 nm, or the like.

Further, the vias penetrate all the first material layers 11, except the bottommost one, and all the second material layers WL and reaches a surface of the bottommost first material layer, so as to separate a planar electrode.

In an embodiment as shown in FIG. 2, the multiple vias are arranged in an array. That is, the multiple vias are equally separated in a row direction of the array, and/or equally separated in a column direction of the array. Thereby, a structure of the three-dimensional reservoir is optimized, and accordingly a characteristic of the three-dimensional reservoir is optimized.

Further, the memory layer ML may be grown through various techniques, which include but are not limited to, atomic layer deposition, magnetron sputtering, or ion beam sputtering. The memory layers ML cover the whole sidewall of the vias.

In an embodiment, the memory layer ML is made of a material including but not limited to $HfO_2$, TaOx, HZO, or the like.

In an embodiment, a thickness of the memory layer ML ranges from 2.5 nm to 6 nm. For example, the thickness of the memory layer ML is 2.8 nm, 4 nm, or 5.4 nm.

Concentration of ions may be controlled to adjust a height of the Schottky barrier.

Further, the self-aligned select layer SL is grown through a technique including but not limited to atomic layer deposition, oxygen plasma, or the like. The select layer SL is for suppressing interlayer leakage, and the select layer SL covers a whole of an inner sidewall of the memory layer ML.

In an embodiment, the select layer SL is made of a material including but is not limited to $TiO_2$, $Al_2O_3$, or the like.

In an embodiment, the thickness of the select layer SL ranges from 5 nm to 20 nm. For example, the thickness of the select layer SL is 6 nm, 12 nm, 17 nm, or the like.

In an embodiment, the electrode layer BL is deposited through a technique including but not limited to sputtering. The electrode layer BL serves as a bit line of the three-dimensional reservoir.

In an embodiment, the electrode layer BL is made of a material including but is not limited to TiN, W, Pt, Ru, or the like.

Figure 3:
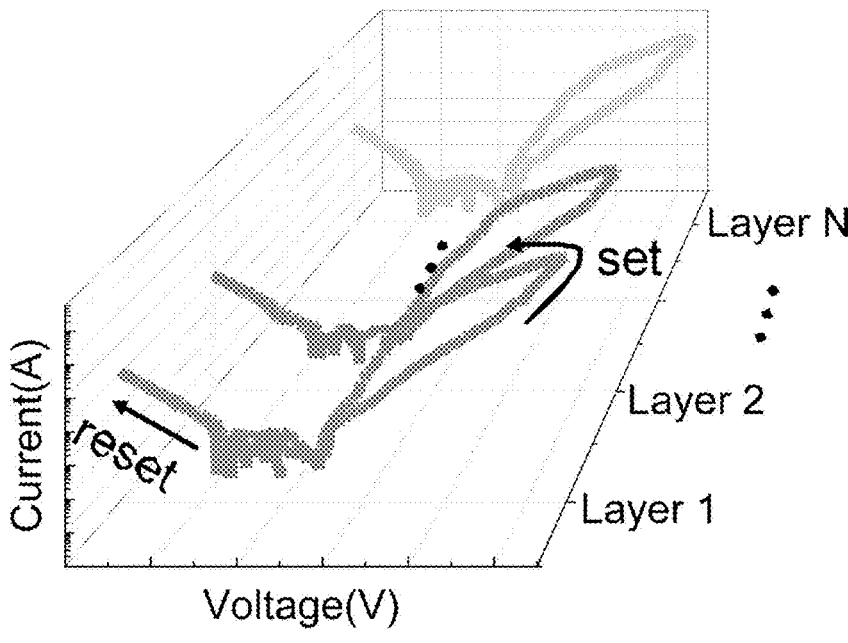
FIG. 3 is a schematic graph of characteristic I-V curves of different layers of a three-dimensional reservoir based on three-dimensional volatile memristors according to an embodiment of the present disclosure.

Reference is made to FIG. 3, which is a schematic graph of characteristic I-V curves of different layers of a three-dimensional reservoir based on three-dimensional volatile memristors according to an embodiment of the present disclosure.

As shown in FIG. 3, the scanned direct-current curves show that each layer of the three-dimensional reservoir has obvious nonlinearity.

Figure 4:
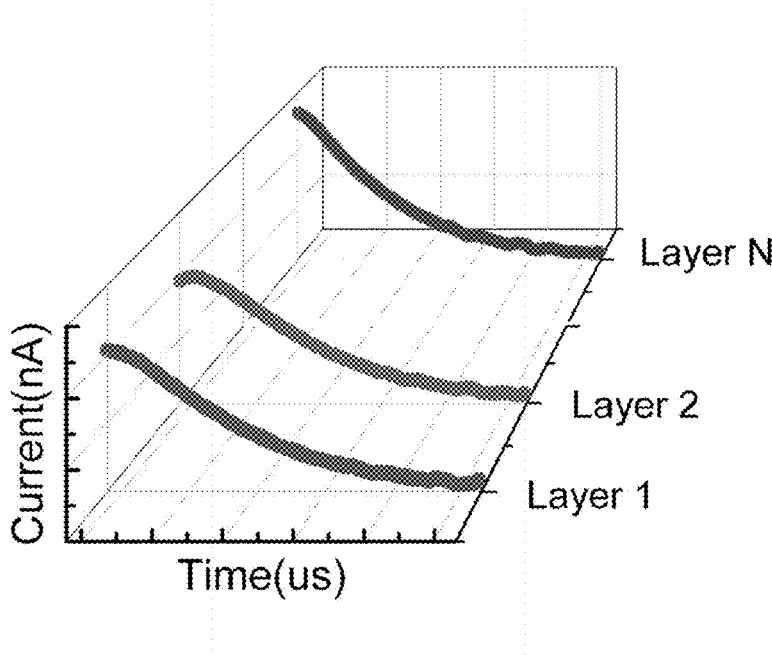
FIG. 4 is a schematic graph of dynamic characteristic curves of different layers of a three-dimensional reservoir based on three-dimensional volatile memristors according to an embodiment of the present disclosure.

Reference is made to FIG. 4, which is a schematic diagram of dynamic characteristic curves of different layers of a three-dimensional reservoir based on three-dimensional volatile memristors according to an embodiment of the present disclosure.

As shown in FIG. 4, the same excitation signal is applied to different layers, and the dynamic characteristic curves of different layers are obtained after the excitation signal disappears. It can be seen from FIG. 4 that there are differences among the dynamic characteristics of the different layers. On such basis, different pulse adjustment may be applied to different layers to obtain a sufficiently large difference among the dynamic characteristics, and such large difference can be used to construct different reservoirs.

Figure 5:
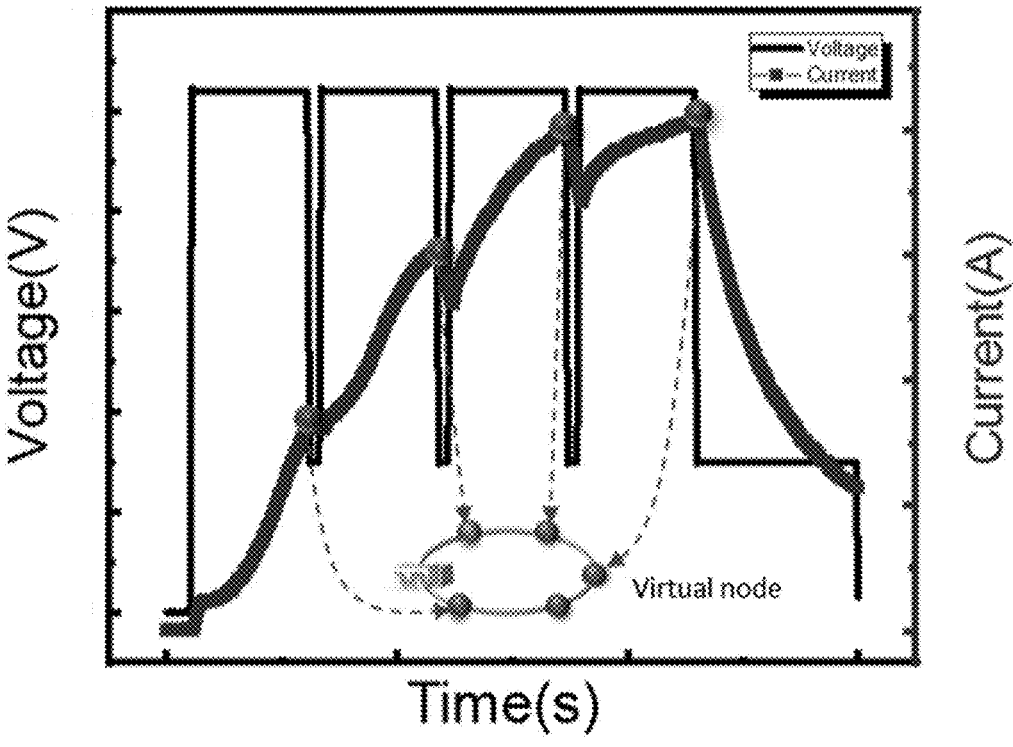
FIG. 5 is a schematic diagram of virtual nodes based on a dynamic characteristic of a memristor according to an embodiment of the present disclosure.
Figure 6:
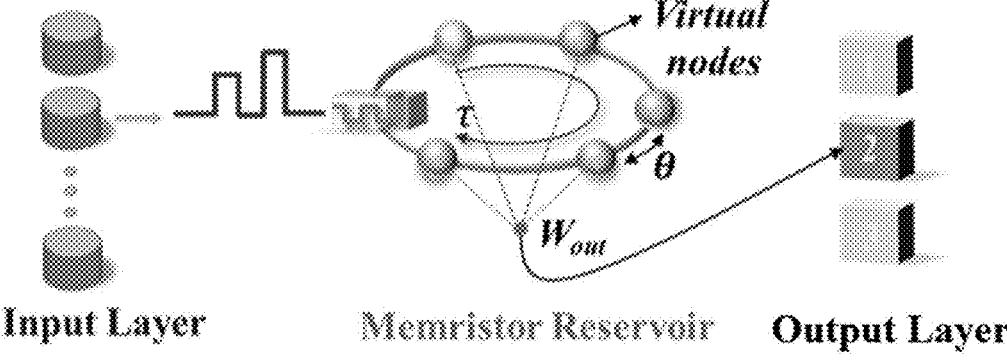
FIG. 6 is a schematic diagram of operation of a reservoir having virtual nodes based on a dynamic characteristic of memristor according to an embodiment of the present disclosure.

Reference is made to FIG. 5, which is a schematic diagram of virtual nodes based on a dynamic characteristic of a memristor according to an embodiment of the present disclosure. Reference is made to FIG. 6, which is a schematic diagram of operation of a reservoir having virtual nodes based on a dynamic characteristic of a memristor according to an embodiment of the present disclosure.

An appropriate sequence of pulses may be applied based on the dynamic characteristic of the memristor as shown in FIG. 5, in order to obtain virtual nodes (i.e., the virtual nodes as shown in FIG. 6) that meet the requirement of an RC system. On a basis of such theory, the three-dimensional reservoir can be constructed with the virtual nodes based on the dynamic characteristic of the memristor.

In other words, the memory layer, the select layer, and the electrode layer in each via form a memristor, i.e., form a reservoir unit. The three-dimensional reservoir is formed based on the stacking structure and the multiple vias. Specifically, the three-dimensional reservoir is constructed by using virtual nodes generated from dynamic characteristics of the three-dimensional memristors. An interfacial memristor is first constructed, and its volatility is verified through electric tests. A vertical three-dimensional array is manufactured based on the volatile memristor. A dynamic characteristic of the memristor is adjusted through a Schottky barrier. Different layers in the three-dimensional reservoir correspond to different reservoirs, which are constructed by controlling memristors in the different layers, respectively. The virtual nodes are enriched, a degree of parallelism and recognition accuracy of a whole system are improved, and an area of the system is reduced.

In an embodiment on a basis of all foregoing embodiments, a method for manufacturing a three-dimensional reservoir which is based on three-dimensional volatile memristors is further provided. Reference is made to FIG. 7, which is a schematic flowchart of a method for manufacturing a three-dimensional reservoir, which is based on three-dimensional volatile memristors, according to an embodiment of the present disclosure.

The method for manufacturing the three-dimensional reservoir based on the three-dimensional volatile memristors comprises steps S101 to S103.

In S101, a stacking structure is formed, where the stacking structure comprises first material layers that are sequentially stacked and one or more second material layers interleaved with the first material layers, and a material of the first material layers is different from a material of the one or more second material layers.

In S102, the stacking structure is etched to form multiple vias penetrating the first material layers and the one or more second material layers, where each via reaches a bottommost one of the first material layers.

In S103, a memory layer, a select layer, and an electrode layer are formed in the above-listed sequence on an inner sidewall of each via.

In this embodiment, the first material layers and the second material layers are alternately deposited on the substrate through a technique including but not limited to physical vapor deposition or chemical vapor deposition, so as to form the stacking structure. Both the uppermost layer and the bottommost layer of the stacking structure are the first material layers.

As an example, the first material layer provides interlayer insulation. The first material layer is made of insulating materials, including but not limited to $SiO_2$ or the like.

In an embodiment, a thickness of the first material layer ranges from 10 nm to 200 nm. For example, the thickness of the first material layer is 35 nm, 68 nm, 115 nm, 167 nm, or the like.

The second material layer serves as a word line of the three-dimensional reservoir. The second material layer is made of a material including but not limited to TiN or TaN.

In an embodiment, a thickness of the second material layer ranges from 5 nm to 100 nm. For example, the thickness of the second material layer is 8 nm, 35 nm, 76 nm, 88 nm, or the like.

Further, the vias penetrate all the first material layers, except the bottommost one, and all the second material layers and reaches a surface of the bottommost first material layer, so as to separate a planar electrode.

In an embodiment as shown in FIG. 2, the multiple vias are arranged in an array. That is, the multiple vias are equally separated in a row direction of the array, and/or equally separated in a column direction of the array. Thereby, a structure of the three-dimensional reservoir is optimized, and accordingly a characteristic of the three-dimensional reservoir is optimized.

Further, the memory layer may be grown through various techniques, which include but are not limited to, atomic layer deposition, magnetron sputtering, or ion beam sputtering. The memory layers ML cover the whole sidewall of the vias.

In an embodiment, the memory layer is made of a material including but not limited to $HfO_2$, TaOx, HZO, or the like.

In an embodiment, a thickness of the memory layer ML ranges from 2.5 nm to 6 nm. For example, the thickness of the memory layer ML is 2.8 nm, 4 nm, or 5.4 nm.

Concentration of ions may be controlled to adjust a height of the Schottky barrier.

Further, the self-aligned select layer SL is grown through a technique including but not limited to atomic layer deposition, oxygen plasma, or the like. The select layer SL is for suppressing interlayer leakage, and the select layer SL covers a whole of an inner sidewall of the memory layer ML.

In an embodiment, the select layer SL is made of a material including but is not limited to $TiO_2$, $Al_2O_3$, or the like.

In an embodiment, the thickness of the select layer SL ranges from 5 nm to 20 nm. For example, the thickness of the select layer SL is 6 nm, 12 nm, 17 nm, or the like.

In an embodiment, the electrode layer BL is deposited through a technique including but not limited to sputtering. The electrode layer BL serves as a bit line of the three-dimensional reservoir.

In an embodiment, the electrode layer BL is made of a material including but is not limited to TiN, W, Pt, Ru, or the like.

A principle of the three-dimensional reservoir manufactured by the method is identical to that of the three-dimensional reservoir according to the foregoing embodiments of the present disclosure, and is not repeated herein.

Hereinabove the three-dimensional reservoir based on three-dimensional volatile memristors and the method for manufacturing the same are described in detail according to embodiments of the present disclosure. Principles and implementations of the present disclosure are described by using specific embodiments herein. Description of the above embodiments is merely intended for helping understand the method and key concepts of the present disclosure. In addition, it should be noted that those skilled in the art may make some variations to specific implementations and application scopes based on the concepts of the present disclosure. Hence, the content of this specification should not be construed as a limitation to the present disclosure.

It should be noted that the embodiments of the present disclosure are described in a progressive manner, and each embodiment places emphasis on the difference from other embodiments. Therefore, one embodiment can refer to other embodiments for the same or similar parts. Since devices disclosed in the embodiments correspond to methods disclosed in the embodiments, the description of the devices is simple, and reference may be made to the relevant part of the methods.

It should be noted that, the relationship terms such as "first", "second" and the like are only used herein to distinguish one entity or operation from another, rather than to necessitate or imply that an actual relationship or order exists between the entities or operations. Furthermore, the terms such as "include", "comprise" or any other variants thereof means to be non-exclusive. Therefore, a process, a method, an article or a device including a series of elements include not only the disclosed elements but also other elements that are not clearly enumerated, or further include inherent elements of the process, the method, the article or the device. Unless expressively limited, the statement "including a . . . " does not exclude the case that other similar elements may exist in the process, the method, the article or the device other than enumerated elements.

According to the description of the disclosed embodiments, those skilled in the art can implement or use the present disclosure. Various modifications made to these embodiments may be obvious to those skilled in the art, and the general principle defined herein may be implemented in other embodiments without departing from the spirit or scope of the present disclosure. Therefore, the present disclosure is not limited to the embodiments described herein but conforms to a widest scope in accordance with principles and novel features disclosed in the present disclosure.

The invention claimed is:

1. A three-dimensional reservoir based on three-dimensional volatile memristors, comprising:
   a stacking structure, comprising first material layers that are sequentially stacked, and one or more second material layers interleaved with the first material layers, wherein a material of the first material layers is different from a material of the one or more second material layers;
   a plurality of vias penetrating the first material layers and the one or more second material layers, wherein each via reaches a bottommost one of the first material layers; and
   a memory layer, a select layer, and an electrode layer, which are disposed in the above-listed sequence on an inner sidewall of each via.

2. The three-dimensional reservoir according to claim 1, wherein the plurality of vias are arranged in an array.

3. The three-dimensional reservoir according to claim 1, wherein a thickness of each first material layer ranges from 10 nm to 200 nm.

4. The three-dimensional reservoir according to claim 1, wherein a thickness of each second material layer ranges from 5 nm to 100 nm.

5. The three-dimensional reservoir according to claim 1, wherein a thickness of the memory layer ranges from 2.5 nm to 6 nm.

6. The three-dimensional reservoir according to claim 1, wherein a thickness of the select layer ranges from 5 nm to 20 nm.

7. The three-dimensional reservoir according to claim 1, wherein each first material layer is made of $SiO_2$, and each second material layer is made of TiN or TaN.

8. A method for manufacturing a three-dimensional reservoir, which is based on three-dimensional volatile memristors, comprising:
   forming a stacking structure, wherein the stacking structure comprises first material layers that are sequentially stacked and one or more second material layers interleaved with the first material layers, and a material of the first material layers is different from a material of the one or more second material layers;
   etching the stacking structure to form a plurality of vias which penetrate the first material layers and the one or more second material layers, wherein each via reaches a bottommost one of the first material layers; and forming a memory layer, a select layer, and an electrode layer in the above-listed sequence on an inner sidewall of each via.

* * * * *